(12) United States Patent
He et al.

(10) Patent No.: US 7,573,103 B1
(45) Date of Patent: *Aug. 11, 2009

(54) BACK-TO-BACK NPN/PNP PROTECTION DIODES

(75) Inventors: Yi He, Fremont, CA (US); Zhizheng Liu, San Jose, CA (US); Meng Ding, Mountain View, CA (US); Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/855,704

(22) Filed: Sep. 14, 2007

Related U.S. Application Data

(63) Continuation of application No. 11/194,449, filed on Aug. 2, 2005, now Pat. No. 7,285,827.

(51) Int. Cl.
  *H01L 27/06* (2006.01)
(52) U.S. Cl. .............. 257/355; 257/173; 257/E27.016
(58) Field of Classification Search .......... 257/173, 257/355, E27.016
  See application file for complete search history.

(56) References Cited

U.S. PATENT DOCUMENTS

| | | | |
|---|---|---|---|
| 5,422,507 A * | 6/1995 | Wanlass | 257/355 |
| 5,900,665 A | 5/1999 | Tobita | |
| 5,994,741 A * | 11/1999 | Koizumi et al. | 257/355 |
| 6,407,414 B1 * | 6/2002 | Yu | 257/173 |
| 7,112,853 B2 * | 9/2006 | Li et al. | 257/362 |
| 7,274,071 B2 * | 9/2007 | Ando et al. | 257/355 |

(Continued)

OTHER PUBLICATIONS

U.S. Appl. No. 11/194,449, filed Aug. 2, 2005.

*Primary Examiner*—Victor A Mandala
(74) *Attorney, Agent, or Firm*—Harrity & Harrity, LLP

(57) ABSTRACT

A device includes a memory device and an NPN or PNP diode coupled to a word-line of the memory device. The NPN diode includes a p-type substrate connected to ground, a well of n-type material formed in the p-type substrate in direct physical contact with the p-type substrate and electrically connected to the p-type substrate via a first metal line, a well of p-type material formed in the first well of n-type material, a first n-type region formed in the well of p-type material in direct physical contact with the well of p-type material and connected to the word line of the memory device, and a first p-type region formed in the well of n-type material in direct physical contact with the well of n-type material and electrically connected to the well of p-type material via a second metal line. The PNP diode includes a n-type substrate connected to ground, a well of p-type material formed in the n-type substrate in direct physical contact with the n-type substrate and electrically connected to the n-type substrate via a first metal line, a well of n-type material formed in the first well of p-type material, a first p-type region formed in the well of n-type material in direct physical contact with the well of n-type material and connected to the word line of the memory device, and a first n-type region formed in the well of p-type material in direct physical contact with the well of p-type material and electrically connected to the well of n-type material via a second metal line.

19 Claims, 8 Drawing Sheets

U.S. PATENT DOCUMENTS

| | | | |
|---|---|---|---|
| 7,285,827 B1 * | 10/2007 | He et al. | 257/355 |
| 2005/0051847 A1 * | 3/2005 | Tsuji et al. | 257/355 |
| 2005/0121725 A1 | 6/2005 | Ando et al. | |
| 2005/0280091 A1 * | 12/2005 | Huang et al. | 257/355 |
| 2006/0145263 A1 | 7/2006 | Chou | |

* cited by examiner

BACK-TO-BACK NPN/PNP PROTECTION DIODES

RELATED APPLICATION

The present application is a continuation of U.S. application Ser. No. 11/194,449, entitled "Back-to-Back NPN/PNP Protection Diodes" and filed Aug. 2, 2005, the disclosure of which is incorporated by reference herein in its entirety.

TECHNICAL FIELD

The present invention relates generally to semiconductor devices. The invention has particular applicability to protecting semiconductor devices from charging using NPN or PNP protection diodes.

BACKGROUND ART

Etching processes, such as plasma etching, may be used to fabricate integrated semiconductor devices. Typically, however, during such processes, charge may flow on interconnect lines that connect to a gate of such devices. Due to the relatively high capacitance of the gate of the devices, charge may build up (i.e., "charging") disproportionately at the gate of the semiconductor devices. Because gates in many semiconductor devices include a very thin dielectric layer, the dielectric layer is particularly sensitive to charge accumulation.

For example, the performance of semiconductor devices may be degraded by charge build-up. Charging can produce various forms of damage in the materials used in the semiconductor devices, including formation of electron traps in gate dielectrics and the displacement and implantation of atoms at the material surface due to ion bombardment. The accumulated charges may decrease the breakdown voltage of a gate dielectric of a device and further cause shifts in the threshold voltages of the device, resulting in reduced reliability.

DISCLOSURE OF THE INVENTION

According to one aspect consistent with the invention, a protection device may include a well of n-type material formed in a p-type substrate; a well of p-type material formed in the well of n-type material; and a first n-type region formed in the well of p-type material in direct physical contact with the well of p-type material, where the first n-type region is coupled to an other device. The protection device may further include a first p-type region formed in the well of p-type material; a second p-type region formed in the well of n-type material in direct physical contact with the well of n-type material, the second p-type region being electrically connected to the first p-type region via a metal line; and a second n-type region formed in the well of n-type material, where charge flows from the other device to ground through the first n-type region, the well of p-type material, the first p-type region, the metal line, the second p-type region, the well of n-type material, and the second n-type region.

According to another aspect consistent with the invention, a protection device may include a first well of n-type material formed in a p-type substrate; a well of p-type material formed in a first well of n-type material; and a first n-type region formed in the well of p-type material in direct physical contact with the well of p-type material, where the first n-type region is coupled to an other device. The protection device may further include a first p-type region formed in the well of p-type material; a second well of n-type material formed in the p-type substrate; a second p-type region formed in the second well of n-type material in direct physical contact with the second well of n-type material, the second p-type region being electrically connected to the first p-type region via a metal line; and a second n-type region formed in the second well of n-type material, where charge flows from the other device to ground through the first n-type region, the well of p-type material, the first p-type region, the metal line, the second p-type region, the second well of n-type material, and the second n-type region.

According to a further aspect consistent with the invention, a device may include a memory device; and an NPN or PNP diode coupled to a word line of the memory device. The NPN diode may include a p-type substrate connected to ground, a well of n-type material formed in the p-type substrate in direct physical contact with the p-type substrate and electrically connected to the p-type substrate via a first metal line, a well of p-type material formed in the well of n-type material, a first n-type region formed in the well of p-type material in direct physical contact with the well of p-type material and connected to the word line of the memory device, and a first p-type region formed in the well of n-type material in direct physical contact with the well of n-type material and electrically connected to the well of p-type material via a second metal line. The PNP diode may include a n-type substrate connected to ground, a well of p-type material formed in the n-type substrate in direct physical contact with the n-type substrate and electrically connected to the n-type substrate via a first metal line, a well of n-type material formed in the well of p-type material, a first p-type region formed in the well of n-type material in direct physical contact with the well of n-type material and connected to the word line of the memory device, and a first n-type region formed in the well of p-type material in direct physical contact with the well of p-type material and electrically connected to the well of n-type material via a second metal line.

According to another aspect consistent with the invention, a device may include a memory device and an NPN or PNP diode coupled to a word-line of the memory device. The NPN diode may include a p-type substrate connected to ground, a first well of n-type material formed in the p-type substrate in direct physical contact with the p-type substrate, a well of p-type material formed in the first well of n-type material, a first n-type region formed in the well of p-type material in direct physical contact with the well of p-type material and connected to the word line of the memory device, a second well of n-type material formed in the p-type substrate in direct physical contact with the p-type substrate and electrically connected to the p-type substrate via a first metal line, and a first p-type region formed in the second well of n-type material in direct physical contact with the second well of n-type material and electrically connected to the well of p-type material via a second metal line. The PNP diode may include a n-type substrate connected to ground, a first well of p-type material formed in the n-type substrate in direct physical contact with the n-type substrate, a first well of n-type material formed in the well of p-type material, a first p-type region formed in the well of n-type material in direct physical contact with the well of n-type material and connected to the word line of the memory device, a second well of p-type material formed in the n-type substrate in direct physical contact with the n-type substrate and electrically connected to the n-type substrate via a first metal line, and a first n-type region formed in the second well of p-type material in direct physical contact with the second well of p-type material and electrically connected to the well of n-type material via a second metal line.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Implementations consistent with the invention provide back-to-back diodes that protect against unintended charging in semiconductor devices. The back-to-back diodes permit a one-way flow of charges away from the devices being protected, thus, reducing device damage and performance impairment that may result from device charging.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

Figure 1:
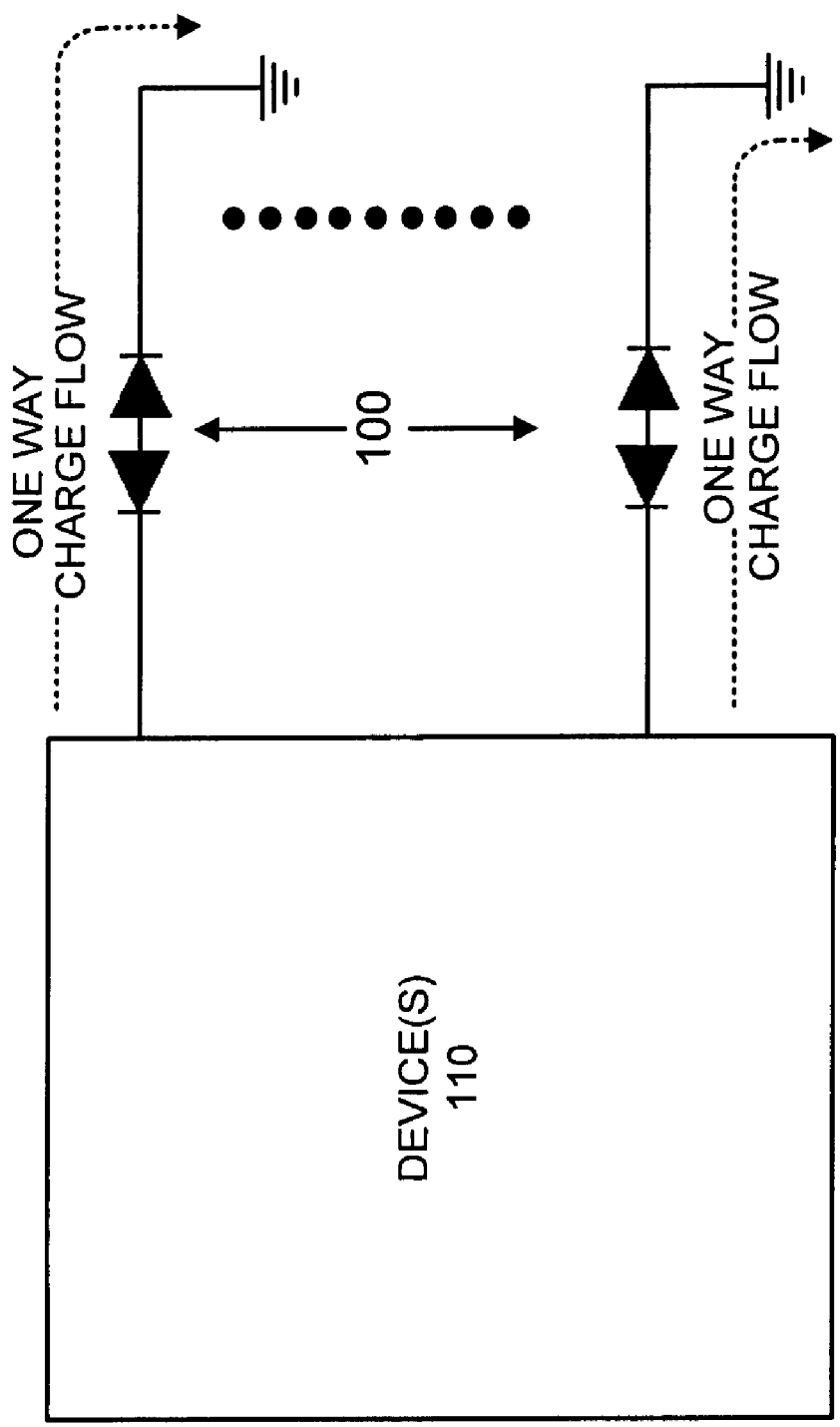
FIG. 1 is a diagram illustrating the use of back-to-back diodes for protecting semiconductor devices from charging consistent with aspects of the invention.

FIG. 1 illustrates the use of a back-to-back diode pair 100 for protecting one or more devices 110 from charging consistent with an implementation of the invention. As shown in FIG. 1, each back-to-back diode pair 100 may be connected to a different portion of device(s) 110. Each diode pair 100 permits the one-way flow of charges away from device(s) 110. Each diode pair 100 may not permit, however, the flow of charges in the opposite direction into device(s) 110. The one-way flow of charges away from device(s) 110 protects components of device(s) 110 from charging that may damage, or impair the performance, of device(s) 110.

Figure 2:
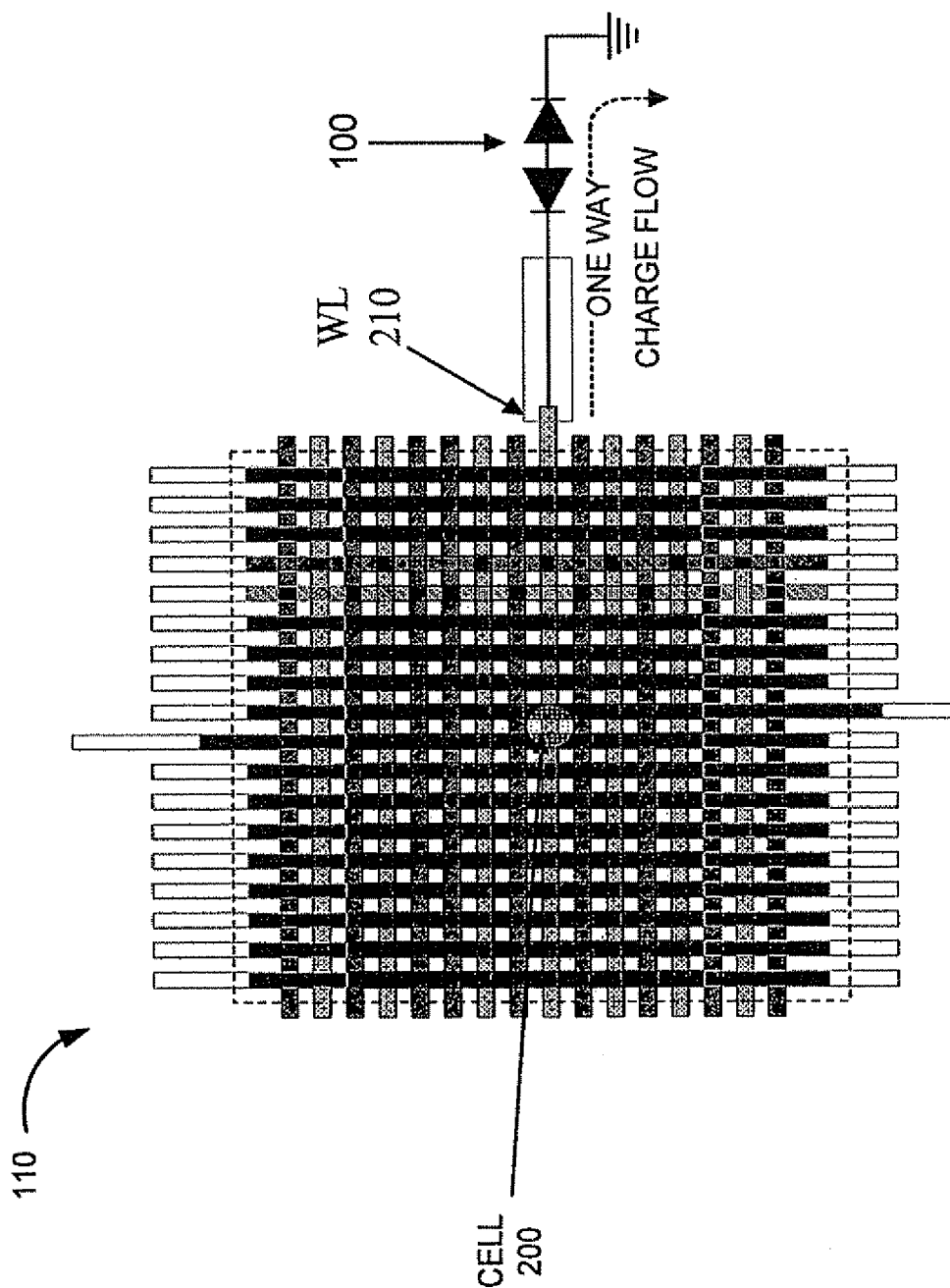
FIG. 2 is a diagram illustrating back-to-back diodes connected to a wordline of a memory cell array to protect one or more cells of the array from charging consistent with an implementation of the invention.

FIG. 2 illustrates one exemplary implementation of the invention in which a device 110 may include a memory cell array. The memory cell array may include an array of multiple memory cells 200, with each cell of the array being connected to a wordline WL 210. Each wordline 210 may further connect to a pair of back-to-back protection diodes 100, thus, permitting the one-way flow of charge from a cell 200 in the array out through the wordline 210. In some implementations, multiple wordlines may be connected to the same pair of protection diodes 100. Protection diodes 100, therefore, help remove charge from each cell 200 in the device 110 or prevent charging of cells 200 that can cause charging damage to components of the device 110 (e.g., damage to a gate dielectric of cell 200).

Figure 3:
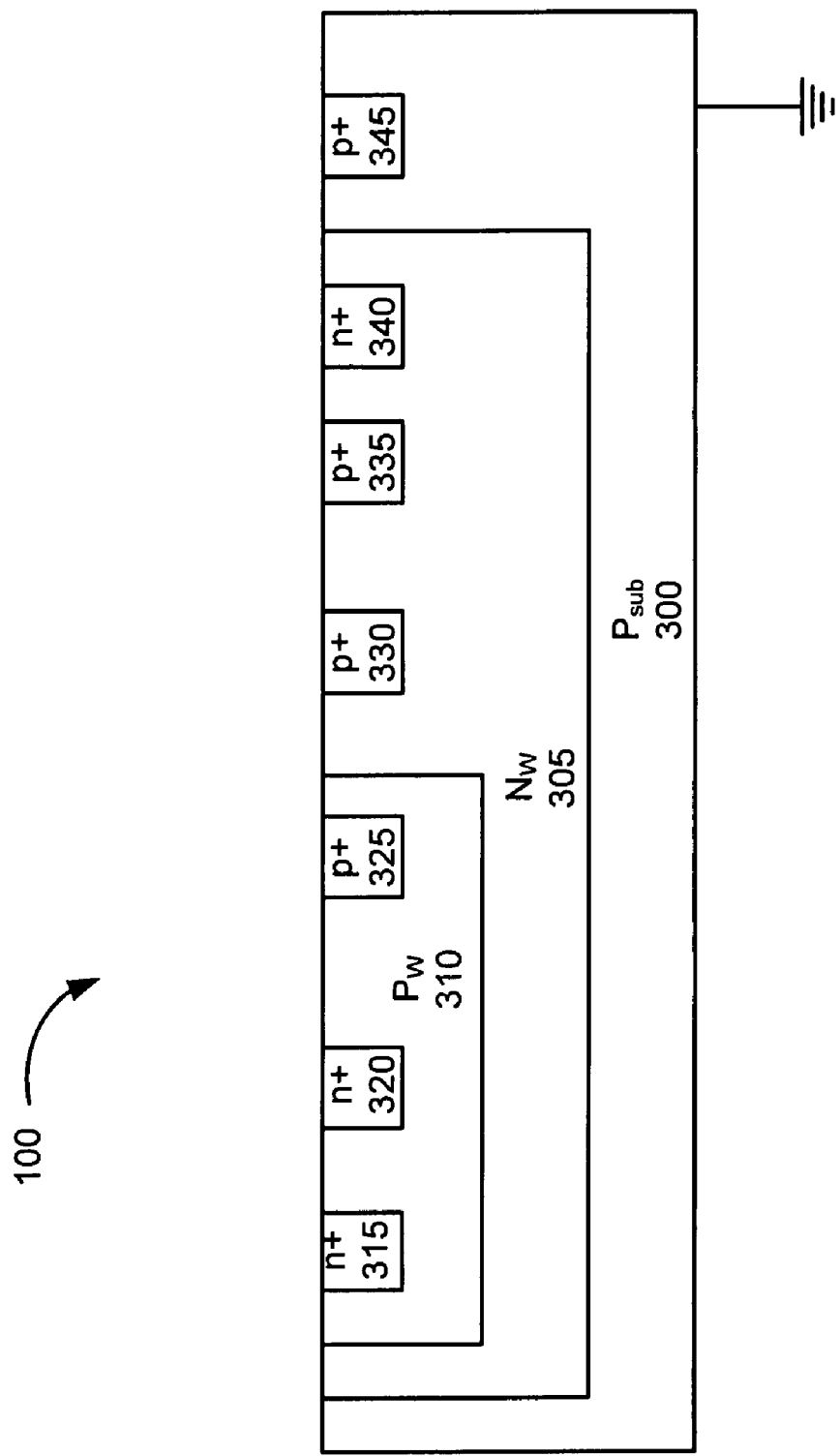
FIG. 3 is a cross-section illustrating the formation of P wells, N wells and doped n and p regions in a p-type substrate to form two back-to-back protection diodes consistent with an aspect of the invention.

FIG. 3 illustrates a cross-section of the formation of an NPN back-to-back diode pair 100 consistent with one implementation of the invention. As shown in FIG. 3, a well of n-type material ($N_W$) 305 may be formed in a substrate 300 of p-type material ($P_{sub}$). $P_{sub}$ 300 may include a semi-conducting material, such as, for example, silicon, germanium or silicon-germanium, doped with an acceptor material, such as, for example, boron, or indium. $P_{sub}$ 300 may, as shown in FIG. 3, be electrically grounded. $N_W$ 305 may include a semi-conducting material such as, for example, silicon, germanium, or silicon-germanium doped with a donor material, such as, for example, phosphorous, arsenic or antimony. $N_W$ 305 may be formed to a depth ranging from about 5,000 angstroms (Å) to about 25,000 Å in $P_{sub}$ 300. A well of p-type material ($P_W$) 310 may further be formed in $N_W$ 305. $P_W$ 310 may be formed to a depth ranging from about 3,000 Å to about 10,000 Å in $N_W$ 305. $P_W$ 310 may include a semi-conducting material, such as, for example, silicon, germanium or silicon-germanium, doped with an acceptor, such as, for example, boron, or indium.

A region 315 of heavily doped n-type material (n+) may be formed in $P_W$ 310. Another region 320 of n+ material may additionally be formed in $P_W$ 310. Regions 315 and 320 may be formed to a depth in $P_W$ 310 ranging from about 3,000 Å to about 10,000 Å. Regions 315 and 320 may include a semi-conducting material heavily doped with a donor material, such as, for example, phosphorous, arsenic or antimony. A region 325 of heavily doped p-type material may further be formed in $P_W$ 310. Region 325 may be formed to a depth in $P_W$ 310 ranging from about 200 Å to about 2,000 Å. Region 325 may include a semi-conducting material heavily doped with an acceptor material, such as, for example, boron, or indium.

A region 330 of heavily doped p-type (p+) material may be formed in $N_W$ 305. Another region 335 of p+ material may additionally be formed in $N_W$ 305. Regions 330 and 335 may be formed to a depth in $N_W$ 305 ranging from about 3,000 Å to about 10,000 Å. Regions 330 and 335 may include a semi-conducting material heavily doped with an acceptor material, such as, for example, boron, or indium. A region 340 of heavily doped n-type material may further be formed in $N_W$ 305. Region 340 may be formed to a depth in $N_W$ 305 ranging from about 3,000 Å to about 10,000 Å. Region 340 may include a semi-conducting material heavily doped with a donor material, such as, for example, phosphorous, arsenic or antimony. A region 345 of heavily doped p-type material may also be formed in $P_{sub}$ 300. Region 345 may be formed to a depth in $P_{sub}$ 300 ranging from about 200 Å to about 2,000 Å. Region 345 may include a semi-conducting material heavily doped with an acceptor material, such as, for example, boron, or indium.

Figure 4:
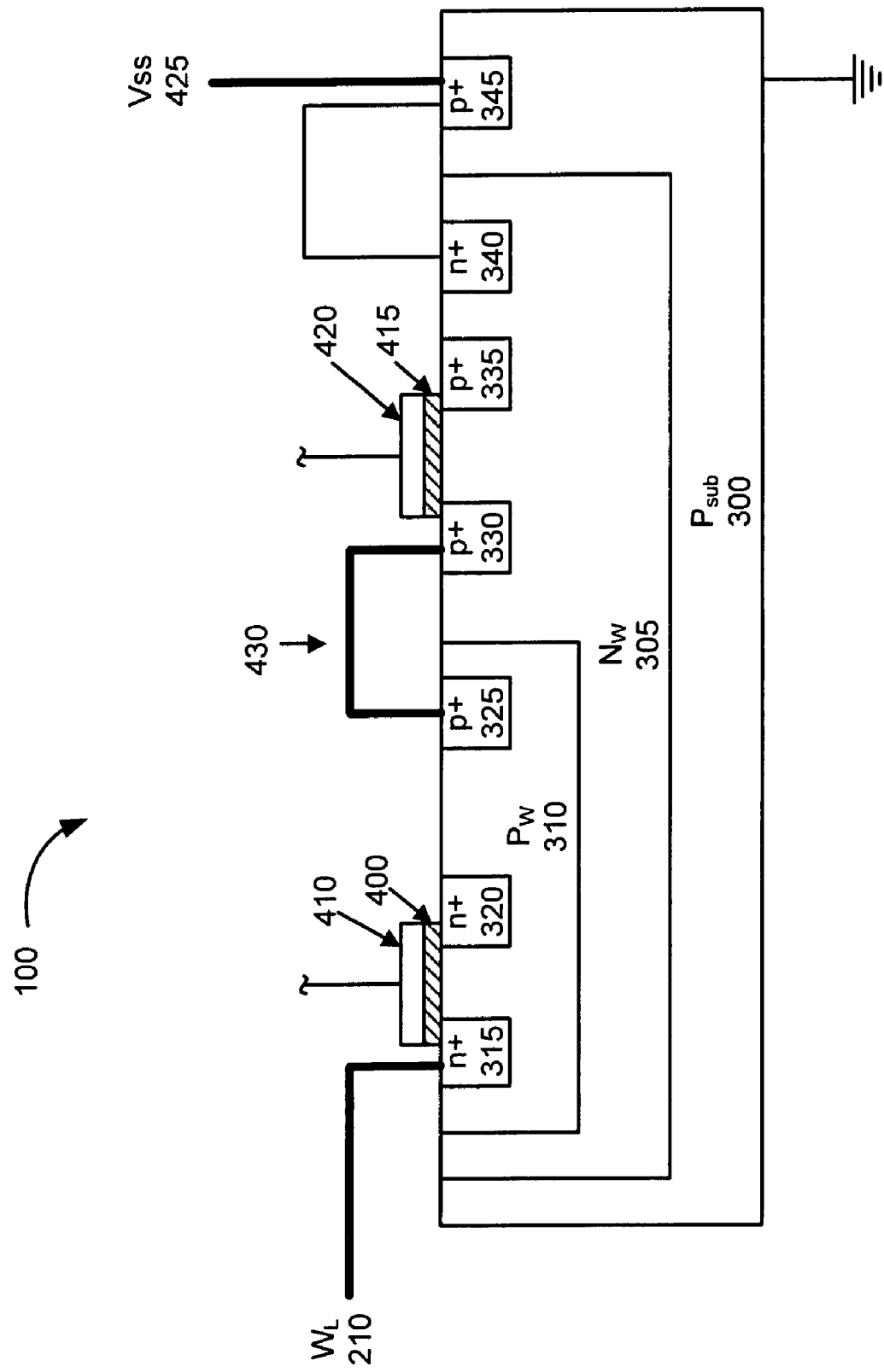
FIG. 4 is a cross-section illustrating the formation of electrical connections and gates for the back-to-back protection diodes of FIG. 3 consistent with an aspect of the invention.

As further shown in FIG. 4, a first gate dielectric 400 and a first gate 410 may be formed over n+ regions 315 and 320. Another gate dielectric 415 and another gate 420 may also be formed over p+ regions 330 and 335. Gate dielectrics 400 and 415 may include a dielectric material, such as, for example, an oxide (e.g., $SiO_2$), SiNx or $SiO_2$/SiNx/$SiO_2$ formed to a thickness ranging from about 30 Å to about 200 Å. Gates 410 and 420 may include a layer of material, such as, for example, polycrystalline silicon, formed to a thickness ranging from about 500 Å to about 5,000 Å. In some implementations, gates 410 and 420 may be electrically connected (not shown) to one another, and to n+ region 340 and p+ region 345, by a metal line. In other implementations, gates 410 and 420 may be left floating. When electrically connected, gates 410 and 420 may be driven by control logic (not shown) that delivers the necessary voltages to the gates during operation. p+ region 325 and p+ region 330 may be electrically connected to one another by a metal line 430. Metal line 430 may represent a metal layer (referred to as the M1 layer) located closest to the substrate layer (i.e., $P_{sub}$ 300). The electrical connection between p+ region 325 and p+ region 330 may further be formed in the M1 layer. A wordline 210 of the memory cell array may be electrically connected to n+ region 315. A voltage source (Vss) 425 may be electrically connected to p+ region 345. The electrical connection between wordline 210 and n+ region 315, and between Vss 425 and p+ region 345 may also be formed in the M1 layer or may be formed in another metal layer (e.g., M2 layer).

As described with respect to FIGS. 3 and 4, back-to-back diode pair 100 may include a gated NP diode that further includes n+ region 315, $P_W$ 310, gate dielectric 400 and gate 410. Back-to-back diode pair 100 may further include a gated PN diode that includes p+ region 330, $N_W$ 305, gate dielectric 415 and gate 420.

Figure 5:
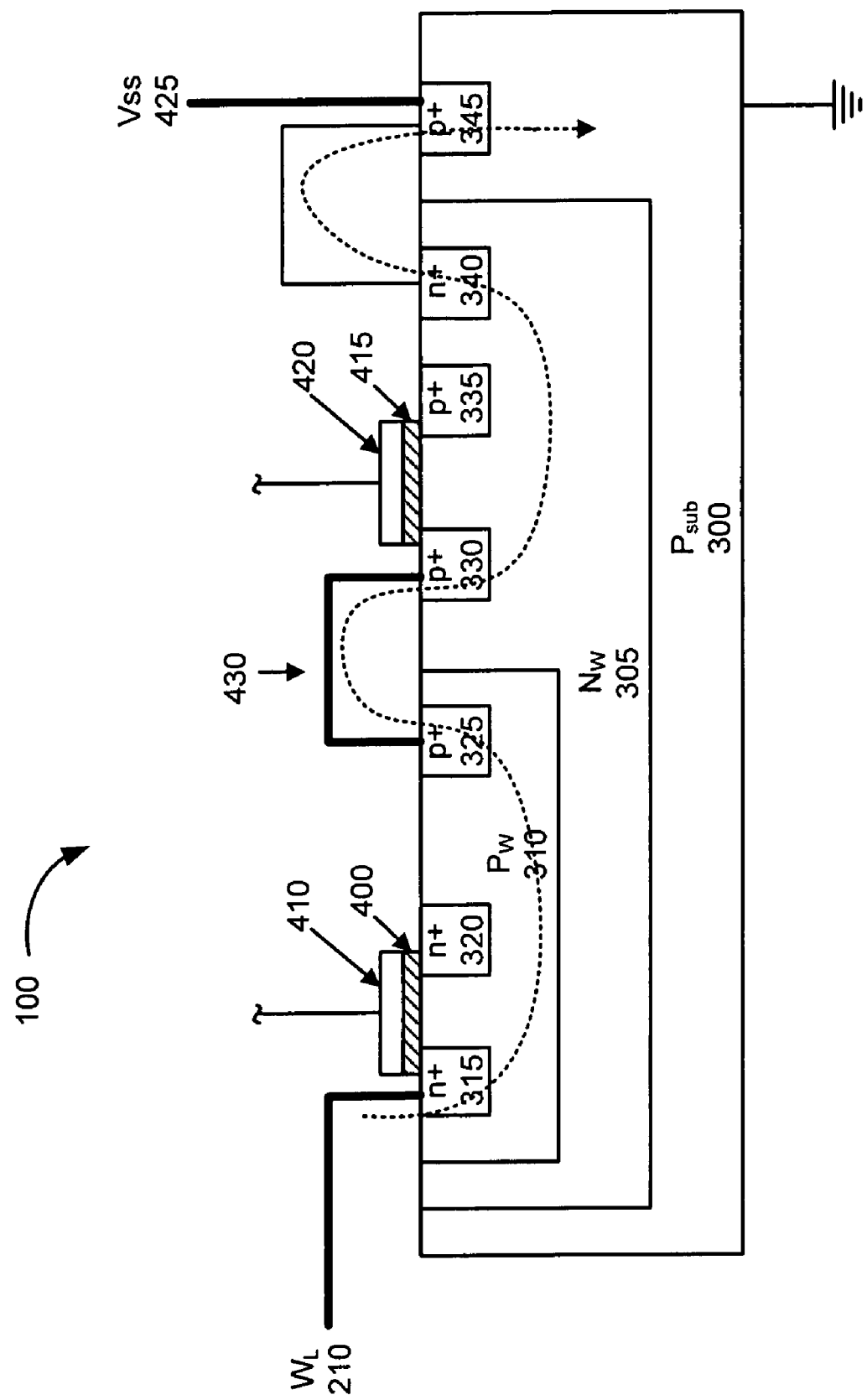
FIG. 5 illustrates charge flow through the back-to-back diodes of FIG. 4 consistent with an aspect of the invention.

FIG. 5 depicts the one-way flow of charge from wordline WL 210 of the memory cell array through diode pair 100. As shown, charge flows from WL 210 through n+ region 315, $P_W$ 310 and p+ region 325. The charge from WL 210 continues to flow through the electrical connection between p+ region 325 and p+ region 330, $N_W$ 305 and n+ region 340. Charge from WL 210 then continues to flow through the electrical connection between n+ region 340 and p+ region 345 to $P_{sub}$ 300 and to ground.

Figure 6:
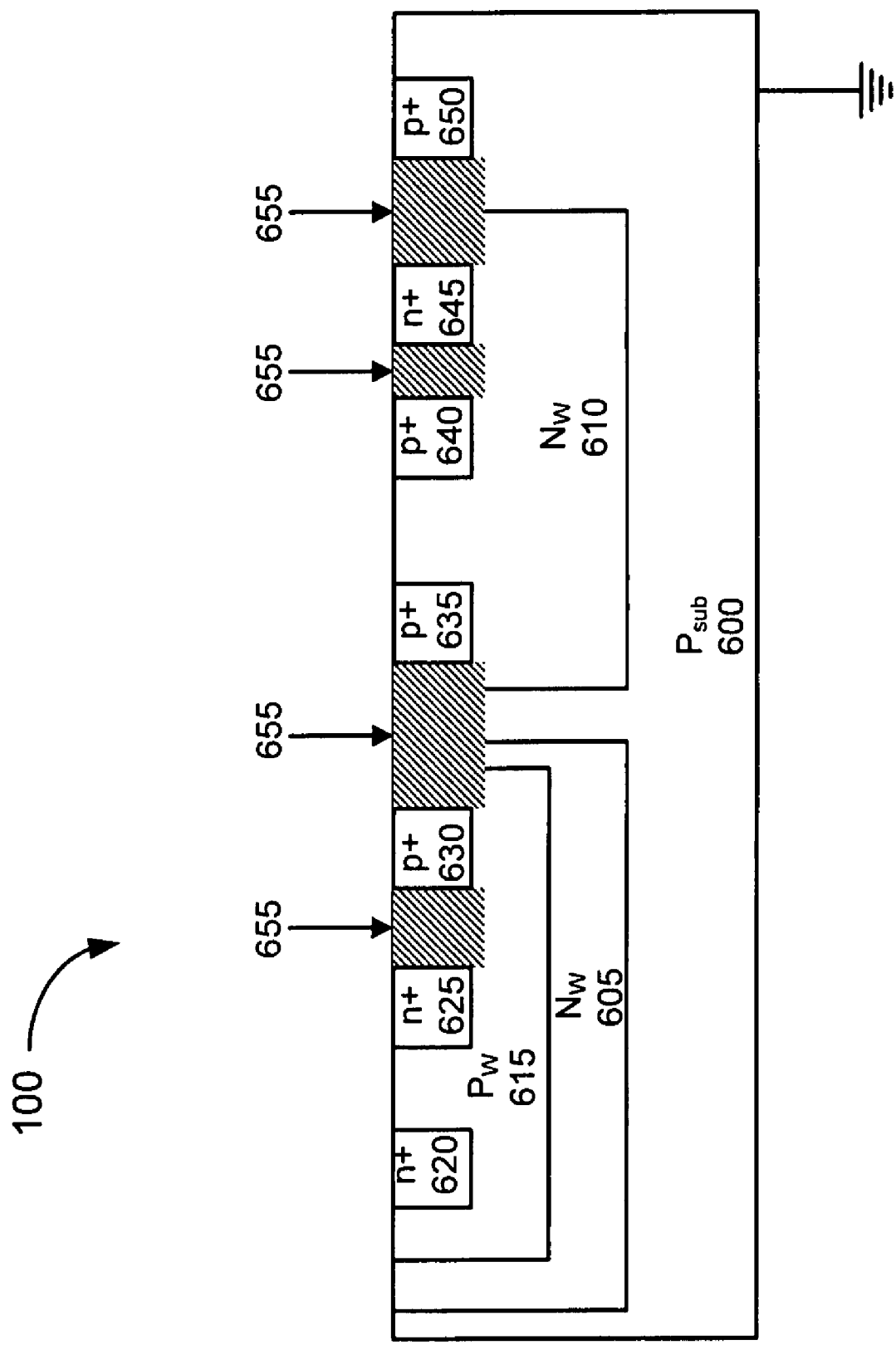
FIG. 6 is a cross-section illustrating the formation of P wells, N wells and doped n and p regions in a p-type substrate to form back-to-back protection diodes consistent with another aspect of the invention.

FIG. 6 illustrates a cross-section of the formation of an NPN back-to-back diode pair 100 consistent with another implementation of the invention. As shown in FIG. 6, a first well of n-type material ($N_W$) 605 may be formed in a substrate 600 of p-type material ($P_{sub}$). $P_{sub}$ 600 may include a semi-conducting material doped with an acceptor material, such as, for example, boron, or indium. $P_{sub}$ 600 may, as shown in FIG. 6, be electrically grounded. $N_W$ 605 may include a semi-conducting material doped with a donor material, such as, for example, phosphorous, arsenic or antimony. $N_W$ 605 may be formed to a depth ranging from about 5,000 Å to about 25,000 Å in $P_{sub}$ 600. A second well of n-type material ($N_W$) 610 may be formed in $P_{sub}$ 600. $N_W$ 610 may include a semi-conducting material doped with a donor material, such as, for example, phosphorous, arsenic or antimony. $N_W$ 610 may be formed to a depth ranging from about 3,000 Å to about 10,000 Å in $P_{sub}$ 600.

A well of p-type material ($P_W$) 615 may further be formed in $N_W$ 605. $P_W$ 615 may be formed to a depth ranging from about 3,000 Å to about 10,000 Å in $N_W$ 605. $P_W$ 615 may include a semi-conducting material doped with an acceptor material, such as, for example, boron, or indium.

A region 620 of heavily doped n-type material (n+) may be formed in $P_W$ 615. Another region 625 of n+ material may additionally be formed in $P_W$ 615. Regions 620 and 625 may be formed to a depth in $P_W$ 615 ranging from about 200 Å to about 2000 Å. Regions 620 and 625 may include a semi-conducting material heavily doped with a donor material, such as, for example, phosphorous, arsenic or antimony. A region 630 of heavily doped p-type material (p+) may further be formed in $P_W$ 615. Region 630 may be formed to a depth in $P_W$ 615 ranging from about 200 Å to about 2,000 Å. Region 630 may include a semi-conducting material heavily doped with an acceptor material, such as, for example, boron, or indium.

A region 635 of heavily doped p-type (p+) material may be formed in $N_W$ 610. Another region 640 of p+ material may additionally be formed in $N_W$ 610. Regions 635 and 640 may be formed to a depth in $N_W$ 610 ranging from about 200 Å to about 2,000 Å. Regions 635 and 640 may include a semi-conducting material heavily doped with an acceptor material, such as, for example, boron, or indium. A region 645 of heavily doped n-type material may further be formed in $N_W$ 610. Region 645 may be formed to a depth in $N_W$ 610 ranging from about 200 Å to about 2,000 Å. Region 645 may include a semi-conducting material heavily doped with a donor material, such as, for example, phosphorous, arsenic or antimony.

A region 650 of heavily doped p-type material may be formed in $P_{sub}$ 600. Region 650 may be formed to a depth in $P_{sub}$ 600 ranging from about 200 Å to about 2,000 Å. Region 650 may include a semi-conducting material heavily doped with an acceptor material, such as, for example, boron, or indium.

As further shown in FIG. 6, regions 625 and 630, regions 630 and 635, regions 640 and 645, and regions 645 and 650 may be electrically isolated from one another using shallow trench isolation (STI). Such isolation may include formation of trenches between corresponding n+ or p+ regions and filling the trenches with a dielectric material 655. Each of the trenches may be formed to a depth ranging from about 500 Å to about 3000 Å.

Figure 7:
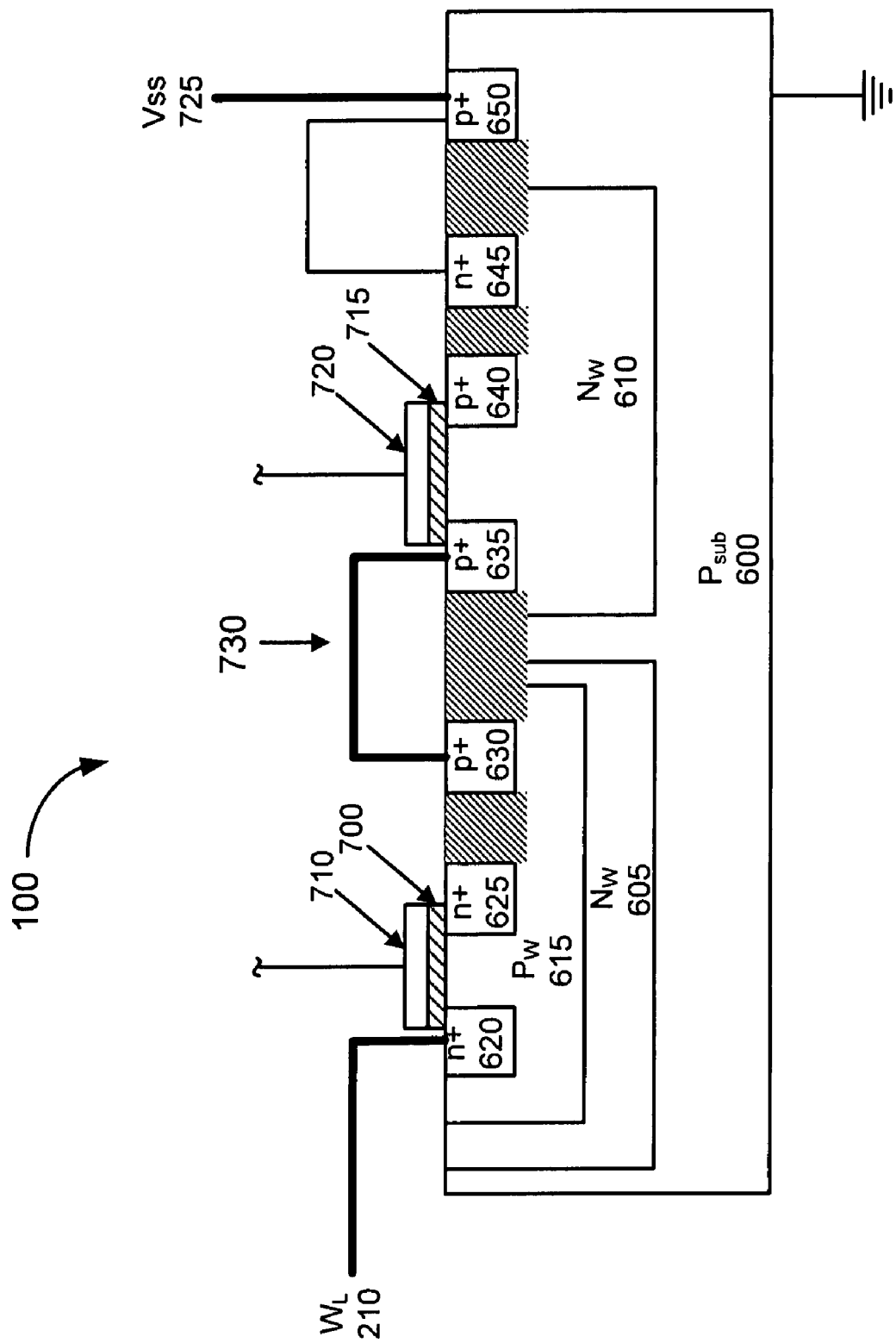
FIG. 7 is a cross-section illustrating the formation of electrical connections and gates for the back-to-back protection diodes of FIG. 6 consistent with an aspect of the invention.

As further shown in FIG. 7, a first gate dielectric 700 and first gate 710 may be formed over n+ regions 620 and 625. Another gate dielectric 715 and another gate 720 may also be formed over p+ regions 635 and 640. Gate dielectrics 700 and 715 may include a dielectric material, such as, for example, an oxide (e.g., $SiO_2$), SiNx or $SiO_2$/SiNx/$SiO_2$ formed to a thickness ranging from about 30 Å to about 200 Å. Gates 710 and 720 may include a layer of material, such as, for example, polycrystalline silicon, formed to a thickness ranging from about 500 Å to about 5,000 Å. In some implementations, gates 710 and 720 may be electrically connected (not shown) to one another, and to n+ region 645 and p+ region 650 by a metal line. In other implementations, gates 410 and 420 may be left floating. When electrically connected, gates 410 and 420 may be driven by control logic (not shown) that delivers the necessary voltages to the gates during operation. p+ region 630 and p+ region 635 may be electrically connected to one another by a metal line 730. Metal line 730 may further be formed, for example, in the M1 layer. A wordline 210 of the memory cell array may be electrically connected to n+ region 620. A voltage source (Vss) 725 may be electrically connected to p+ region 650. The electrical connection between wordline 210 and n+ region 620, and between Vss 725 and p+ region 650 may also be formed in the M1 layer or another layer, such as an M2 layer.

As described with respect to FIGS. 6 and 7, back-to-back diode pair 100 may include a gated NP diode that further includes n+ region 620, $P_W$ 615, gate dielectric 700 and gate 710. Back-to-back diode pair 100 may further include a gated PN diode that includes P+ region 635, $N_W$ 610, gate dielectric 715, and gate 720.

Figure 8:
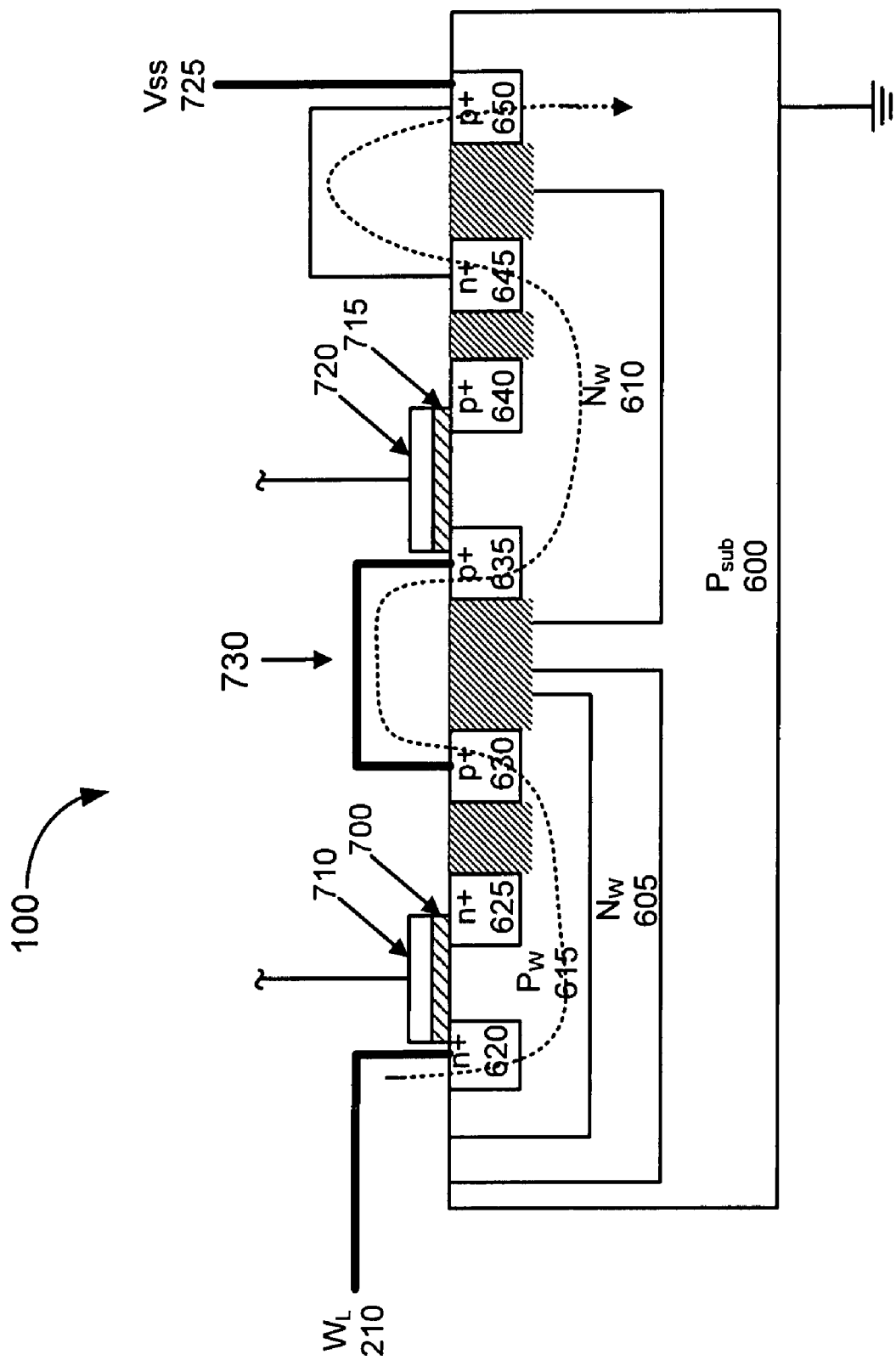
FIG. 8 illustrates charge flow through the back-to-back diodes of FIG. 7 consistent with an aspect of the invention.

FIG. 8 depicts the one-way flow of charge from wordline WL 210 of the memory cell array through diode pair 100. As shown, charge flows from WL 210 through n+ region 620, $P_W$ 615 and p+ region 630. The charge from WL 210 continues to flow through the electrical connection between p+ region 630 and P+ region 635, $N_W$ 610 and n+ region 645. Charge from WL 210 then continues to flow through the electrical connection between n+ region 645 and p+ region 650 to $P_{sub}$ 600 and to ground.

In summary, the back-to-back diode pair 100, described above with respect to the implementations of FIGS. 3-5 and 6-8, protects against charging in semiconductor devices. The back-to-back diodes reduce device damage and performance impairment that may result from device charging by drawing charges away from the devices being protected and preventing current from flowing into the memory array. Charging in memory devices results in alterations to the device threshold voltages (Vt). Use of back-to-back diodes 100, consistent with aspects of the invention, may, thus, improve Vt distribution and device operating range.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention. The dielectric and conductive layers used in manufacturing a semiconductor device in accordance with the invention can be deposited by conventional deposition techniques. For example, various types of CVD processes, including PECVD and low pressure chemical vapor deposition (LPCVD) can be employed. In addition, conventional electroplating, photolithographic and etching techniques may also be employed, and hence, the details of such techniques have not been set forth herein in detail. While aspects of the invention have been described as using a back-to-back NPN diode, one skilled in the art will recognize that a back-to-back PNP diode may alternatively be used. Formation of a PNP diode, instead of a NPN diode, requires that n-type materials described with respect to FIGS. 3 and 6 be switched with p-type materials, and p-type materials be switched with n-type materials. For example, as shown in FIG. 3, n+ region 315 may be formed as a p+ region, p+ region may be formed as a n+ region, $P_W$ 310 may be formed as an N well, $P_{sub}$ 300 may be formed as an n-type substrate, etc.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A protection device, comprising:
    a well of n-type material formed in a p-type substrate;
    a well of p-type material formed in the well of n-type material;
    a first n-type region formed in the well of p-type material in direct physical contact with the well of p-type material, where the first n-type region is coupled to an other device;
    a first p-type region formed in the well of p-type material;
    a second p-type region formed in the well of n-type material in direct physical contact with the well of n-type material, the second p-type region being electrically connected to the first p-type region via a metal line; and
    a second n-type region formed in the well of n-type material,
    where charge flows from the other device to ground through the first n-type region, the well of p-type material, the first p-type region, the metal line, the second p-type region, the well of n-type material, and the second n-type region.

2. The protection device of claim 1, where the other device is a memory device and where the first n-type region is coupled to a word line of the memory device.

3. The protection device of claim 1, further comprising:
    a first gate formed over the first n-type region; and
    a second gate formed over the second p-type region.

4. The protection device of claim 1, further comprising:
    a third p-type region formed in the p-type substrate in direct physical contact with the p-type substrate, where the third p-type region is coupled to a voltage source and electrically connected to the second n-type region via a metal line.

5. The protection device of claim 4, where the charge flows from the other device to ground through the first n-type region, the well of p-type material, the first p-type region, the metal line, the second p-type region, the well of n-type material, the second n-type region, the third p-type region and the p-type substrate.

6. The protection device of claim 1, where the well of n-type material is formed to a depth ranging from about 5,000 Å to about 25,000 Å in the p-type substrate, where the well of p-type material is formed to a depth ranging from about 3,000 Å to about 10,000 Å in the well of n-type material, where the first n-type region is formed to a depth ranging from about 3,000 Å to about 10,000 Å in the well of p-type material, and where the first p-type region is formed to a depth ranging from about 200 Å to about 2,000 Å in the well of p-type material.

7. The protection device of claim 1, where the n-type material, the first n-type region and the second n-type region each include one of silicon, germanium or silicon-germanium doped with one of phosphorous, arsenic or antimony and where the p-type substrate, p-type material, first p-type region, and second p-type region each include one of silicon, germanium or silicon-germanium doped with one of boron or indium.

8. The protection device of claim 1, where the second p-type region is formed to a depth ranging from about 3,000 Å to about 10,000 Å in the well of n-type material, and where the second n-type region is formed to a depth ranging from about 3,000 Å to about 10,000 Å in the well of n-type material.

9. A protection device, comprising:
    a first well of n-type material formed in a p-type substrate;

a well of p-type material formed in a first well of n-type material;

a first n-type region formed in the well of p-type material in direct physical contact with the well of p-type material, where the first n-type region is coupled to an other device;

a first p-type region formed in the well of p-type material;

a second well of n-type material formed in the p-type substrate;

a second p-type region formed in the second well of n-type material in direct physical contact with the second well of n-type material, the second p-type region being electrically connected to the first p-type region via a metal line; and a second n-type region formed in the second well of n-type material, where charge flows from the other device to ground through the first n-type region, the well of p-type material, the first p-type region, the metal line, the second p-type region, the second well of n-type material, and the second n-type region.

10. The protection device of claim 9, where the other device is a memory device and where the first n-type region is coupled to a word line of the memory device.

11. The protection device of claim 9, further comprising:
a first gate formed over the first n-type region; and
a second gate formed over the second p-type region.

12. The protection device of claim 9, further comprising:
a third p-type region formed in the p-type substrate in direct physical contact with the p-type substrate, where the third p-type region is coupled to a voltage source and electrically connected to the second n-type region via a metal line.

13. The protection device of claim 12, where the charge flows from the other device to ground through the first n-type region, the well of p-type material, the first p-type region, the metal line, the second p-type region, the second well of n-type material, the second n-type region, the third p-type region and the p-type substrate.

14. The protection device of claim 9, where the first well of n-type material is formed to a depth ranging from about 5,000 Å to about 25,000 Å in the p-type substrate, where the well of p-type material is formed to a depth ranging from about 3,000 Å to about 10,000 Å in the first well of n-type material, where the first n-type region is formed to a depth ranging from about 3,000 Å to about 10,000 Å in the well of p-type material, and where the first p-type region is formed to a depth ranging from about 200 Å to about 2,000 Å in the well of p-type material.

15. The protection device of claim 9, where the n-type material, the first n-type region and the second n-type region include one of silicon, germanium or silicon-germanium doped with one of phosphorous, arsenic or antimony and where the p-type substrate, p-type material, first p-type region and second p-type region include one of silicon, germanium or silicon-germanium doped with one of boron or indium.

16. The protection device of claim 9, where the second p-type region is formed to a depth ranging from about 3,000 Å to about 10,000 Å in the second well of n-type material, and where the second n-type region is formed to a depth ranging from about 3,000 Å to about 10,000 Å in the second well of n-type material.

17. The protection device of claim 16, where the second well of n-type material is formed to a depth ranging from about 3,000 Å to about 10,000 Å in the p-type substrate, where the second p-type region is formed to a depth ranging from about 200 Å to about 2,000 Å in the second well of n-type material, and where the second n-type region is formed to a depth ranging from about 200 Å to about 2,000 Å in the second well of n-type material.

18. A device, comprising:
a memory device; and
an NPN or PNP diode coupled to a word line of the memory device,
where the NPN diode comprises:
a p-type substrate connected to ground,
a well of n-type material formed in the p-type substrate in direct physical contact with the p-type substrate and electrically connected to the p-type substrate via a first metal line,
a well of p-type material formed in the well of n-type material,
a first n-type region formed in the well of p-type material in direct physical contact with the well of p-type material and connected to the word line of the memory device, and
a first p-type region formed in the well of n-type material in direct physical contact with the well of n-type material and electrically connected to the well of p-type material via a second metal line;
and where the PNP diode comprises:
a n-type substrate connected to ground,
a well of p-type material formed in the n-type substrate in direct physical contact with the n-type substrate and electrically connected to the n-type substrate via a first metal line,
a well of n-type material formed in the well of p-type material,
a first p-type region formed in the well of n-type material in direct physical contact with the well of n-type material and connected to the word line of the memory device, and
a first n-type region formed in the well of p-type material in direct physical contact with the well of p-type material and electrically connected to the well of n-type material via a second metal line.

19. A device, comprising:
a memory device; and
an NPN or PNP diode coupled to a word line of the memory device,
where the NPN diode comprises:
a p-type substrate connected to ground,
a first well of n-type material formed in the p-type substrate in direct physical contact with the p-type substrate,
a well of p-type material formed in the first well of n-type material,
a first n-type region formed in the well of p-type material in direct physical contact with the well of p-type material and connected to the word line of the memory device,
a second well of n-type material formed in the p-type substrate in direct physical contact with the p-type substrate and electrically connected to the p-type substrate via a first metal line, and
a first p-type region formed in the second well of n-type material in direct physical contact with the second well of n-type material and electrically connected to the well of p-type material via a second metal line;
and where the PNP diode comprises:
a n-type substrate connected to ground,
a first well of p-type material formed in the n-type substrate in direct physical contact with the n-type substrate, a well of n-type material formed in the first well of p-type material, a first p-type region formed in the well of n-type material in direct physical contact with the well of n-type material and connected to the word line of the memory device, a second well of p-type material formed in the n-type substrate in direct physical contact with the n-type substrate and electrically connected to the n-type substrate via a first metal line, and a first n-type region formed in the second well of p-type material in direct physical contact with the second well of p-type material and electrically connected to the well of n-type material via a second metal line.

* * * * *